(12) United States Patent
Li

(10) Patent No.: US 7,421,052 B2
(45) Date of Patent: Sep. 2, 2008

(54) OSCILLATOR FREQUENCY SELECTION

(75) Inventor: Shenggao Li, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 614 days.

(21) Appl. No.: 11/139,809

(22) Filed: May 27, 2005

(65) Prior Publication Data

US 2006/0269014 A1  Nov. 30, 2006

(51) Int. Cl.
*H03D 3/24* (2006.01)
*H03D 3/18* (2006.01)

(52) U.S. Cl. .................. 375/374; 375/375; 375/327

(58) Field of Classification Search .............. 375/327, 375/324, 322, 316; 331/46, 48; 381/103; 708/323
See application file for complete search history.

(56) References Cited

U.S. PATENT DOCUMENTS

| | | | | |
|---|---|---|---|---|
| 4,272,729 A | * | 6/1981 | Riley, Jr. ............... | 331/1 A |
| 6,608,527 B2 | * | 8/2003 | Moloudi et al. ......... | 330/301 |
| 6,651,250 B1 | * | 11/2003 | Takai ..................... | 725/31 |
| 6,803,830 B2 | * | 10/2004 | Scheffler ............... | 331/36 C |
| 6,870,432 B2 | | 3/2005 | Li et al. | |
| 2002/0097070 A1 | * | 7/2002 | Gater .................... | 327/12 |
| 2005/0030935 A1 | * | 2/2005 | Seisenberger et al. .... | 370/350 |
| 2006/0211393 A1 | * | 9/2006 | Chien .................... | 455/265 |

OTHER PUBLICATIONS

Shenggao Li and Mohammed Ismail, "A 10-GHz CMOS Quadrature LC-VCO for Multirate Optical Applications", IEEE Journal of Solid-State Circuits, vol. 38, No. 10, Oct. 2003, pp. 1626-1634.

* cited by examiner

*Primary Examiner*—David C. Payne
*Assistant Examiner*—Brian J Stevens
(74) *Attorney, Agent, or Firm*—Buckley, Maschoff & Talwalkar LLC

(57) ABSTRACT

According to some embodiments, a frequency adjuster adjusts a frequency of an oscillator. For example, the frequency adjuster might include a plurality of capacitors that are selectable using a digital control signal, and selection logic may adjust the digital control signal based on a received indication associated with the oscillator's frequency.

6 Claims, 11 Drawing Sheets

```
DETERMINE A FREQUENCY
ASSOCIATED WITH AN OSCILLATOR
                              202
```

```
ADJUST A FREQUENCY OF
THE OSCILLATOR VIA FREQUENCY
        ADJUSTER
                              204
```

FIG. 2

OSCILLATOR FREQUENCY SELECTION

BACKGROUND

A communication system may use an oscillator to generate in-phase and/or quadrature-phase clock signals (e.g., four clock signals, each offset in phase by 90 degrees) to receive and/or transmit signals. Moreover, in some cases it may be desirable to adjust the frequency of these signals (e.g., to tune the signals and/or to support different communication protocols, needs, or techniques).

BRIEF DESCRIPTION OF THE DRAWINGS

FIG. 2 is a flow chart of a method according to some embodiments.

DETAILED DESCRIPTION

Figure 1:
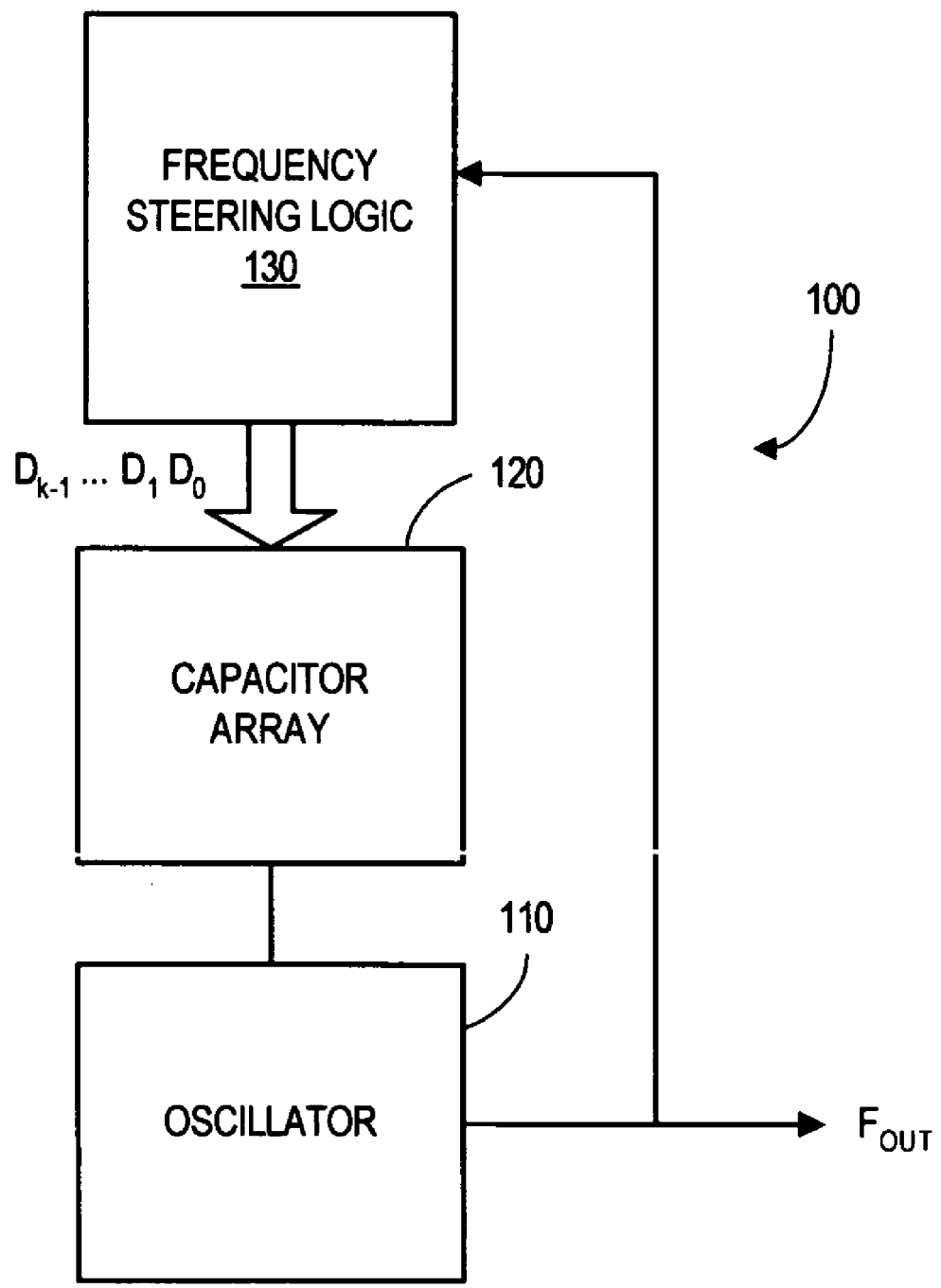
FIG. 1 is a block diagram of an apparatus according to some embodiments.

FIG. 1 is a block diagram of an apparatus 100 according to some embodiments. The apparatus 100 includes an oscillator 110 that generates a signal having a frequency $F_{OUT}$. The signal might, for example, be used for clock generation and/or clock recovery. According to some embodiments, the signal is associated with a receiver, a transmitter, an optical communication device, and/or a wireless communication device.

In some cases, it may be desirable to adjust $F_{OUT}$. For example, the apparatus 100 might be used in different communication devices that need $F_{OUT}$ to be from 9.95 Giga-Bits-per-second (Gbps) to 12.5 Gbps.

According to some embodiments, a capacitor array 120 associated with the oscillator 110 is used to adjust $F_{OUT}$. The array 120 might comprise, for example, a plurality of selectable capacitors connected in parallel. Moreover, a k-bit digital control signal $D_{k-1} \ldots D_1 D_0$ might be used to select capacitors in the array 120. For example, a digital control signal of "1111" might select all of the capacitors in the array 120 and, as a result, $F_{OUT}$ may be decreased. Similarly, a digital control signal of "0000" might select none of the capacitors in the array 120, and $F_{OUT}$ may be increased. The digital control signal might be generated, for example, by frequency steering logic 130 that receives the signal having frequency $F_{OUT}$.

Note that selection logic may be provided to automatically adjust the digital control signal (and thereby tune the frequency $F_{OUT}$). For example, FIG. 2 is a flow chart of a method that may be associated with selection logic according to some embodiments. At 202, a frequency associated with an oscillator is determined. The frequency might be, for example, a desired frequency (e.g., to support a particular type of communication device or protocol) or a frequency associated with the oscillator's current operation.

At 204, the selection logic automatically adjusts a frequency of the oscillator via a frequency adjuster (e.g., a digitally controlled capacitor array). For example, the selection logic might compare an indication of the oscillator's current frequency with a frequency of a reference signal. In this case, one or more digital control signals might be adjusted if the indication of the oscillator's frequency differs from the frequency of the reference signal by more than a pre-determined threshold.

Figure 3:
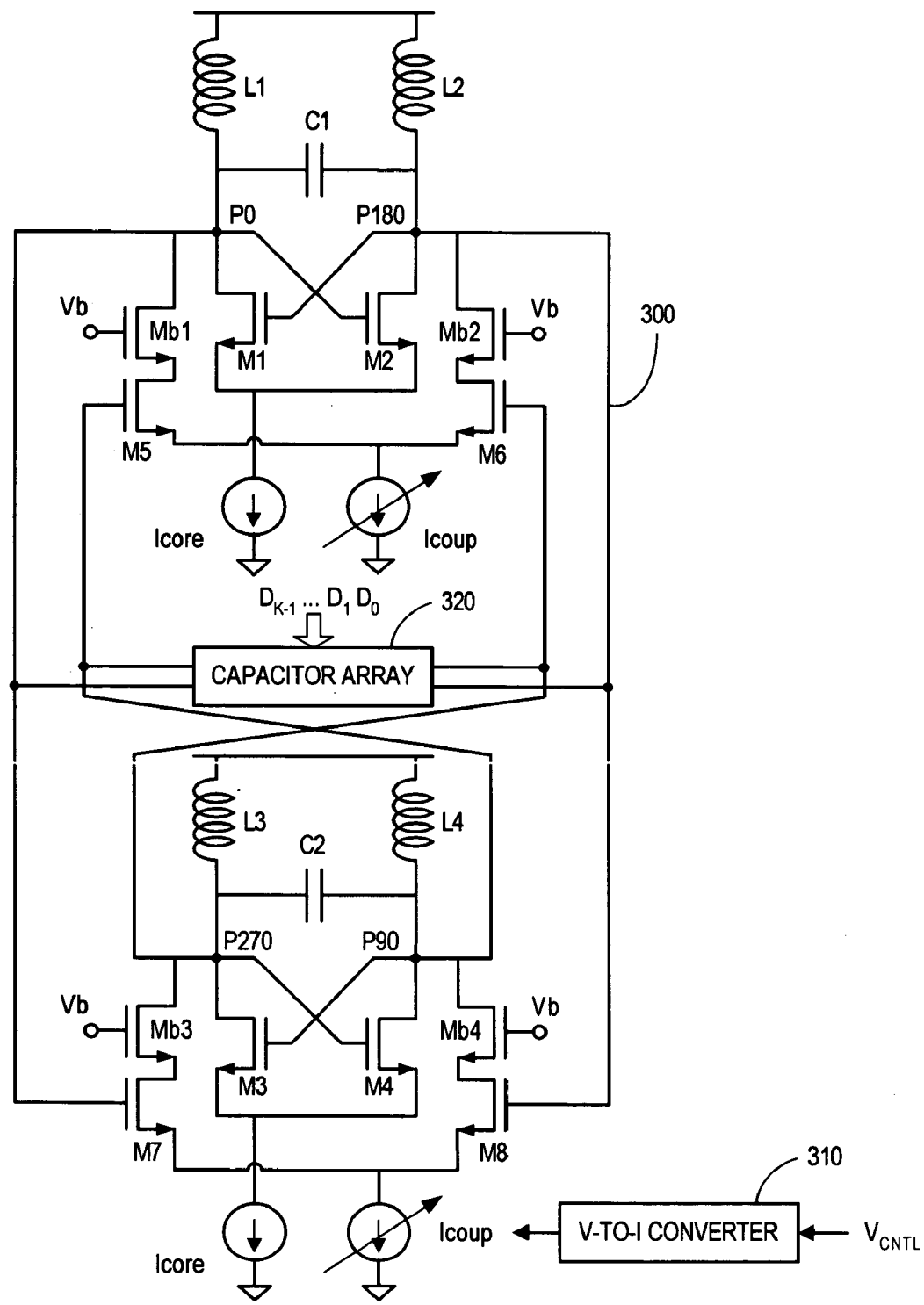
FIG. 3 is a quadrature Voltage Controlled Oscillator (VCO) circuit according to some embodiments.

Some embodiments of the present invention are directed to a quadrature Voltage Controlled Oscillator (VCO), such as the circuit illustrated in FIG. 3. The circuit might, for example, be suitable for clock generation in a communication device, such as a wireless homodyne radio, a Synchronous Optical Network (SONET) device, and/or a System on a Chip (SoC) device.

The top portion of the circuit acts as a first core VCO and the bottom portion acts as a second core VCO. Moreover, the two core VCOs are mutually coupled to form the quadrature VCO 300 with four clock signal nodes (P0, P90, P180, P270). In the first core VCO, transistors M1, M2 along with an Inductance (L) Capacitance (C) tank (inductor L1, inductor L2, and capacitor C1) act as the gain stages. Similarly, transistors M3, M4 along with an LC tank (inductor L3, inductor L4, and capacitor C2) act as the gain stages in the second core VCO.

The coupling stages between the two core VCOs are provided by differential pair transistors M5, M6 and differential pair transistors M7, M8. The bias current for each core VCO is provided by Icore and Icoup. Icore and Icoup alone or together may be used to tune the frequency of the quadrature VCO 300. For example, when Icoup is changed the coupling strength between the two core VCOs will be changed—which will alter the frequency of the quadrature VCO 300. As another approach, capacitor C1 and/or C2 may be used to tune the frequency.

According to some embodiments, unilateral coupling between the two core VCOs is facilitated using cascaded common-source common-gate amplifiers. In particular, Metal Oxide Semiconductor (MOS) transistors Mb1 through Mb4 might be been added to M5 through M8, and each of the four coupling stages may comprise a cascaded common-source common-gate amplifier that acts as a unilateral buffer. Note that such common-source common-gate amplifiers may exhibit relatively high output impedance and voltage gain.

Consider, for example, the coupling from P0 to P270. In this case, transistors Mb3 and M7 are in a cascaded common-source common-gate configuration, the gate of transistor Mb3 being biased by Direct Current (DC) voltage terminal Vb. As a result, the signal at P0 will propagate to P270 as would be expected in a common-source common-gate amplifier. Meanwhile, transistor Mb3 will provide significant attenuation in the reverse direction (from P270 to P0). Since coupling will propagate in a single direction, bi-modal oscillation may be reduced (even over process, supply, and/or temperature variations). Moreover, the circuit may exhibit acceptable jitter performance, may be less complex, and may consume less power as compared to an injection-locked quadrature VCO.

According to some embodiments, a voltage-to-current (V-to-I) converter 310 is used to adjust Icoup (and therefore the oscillating frequency) based on an input voltage Vcnt1.

Figure 4:
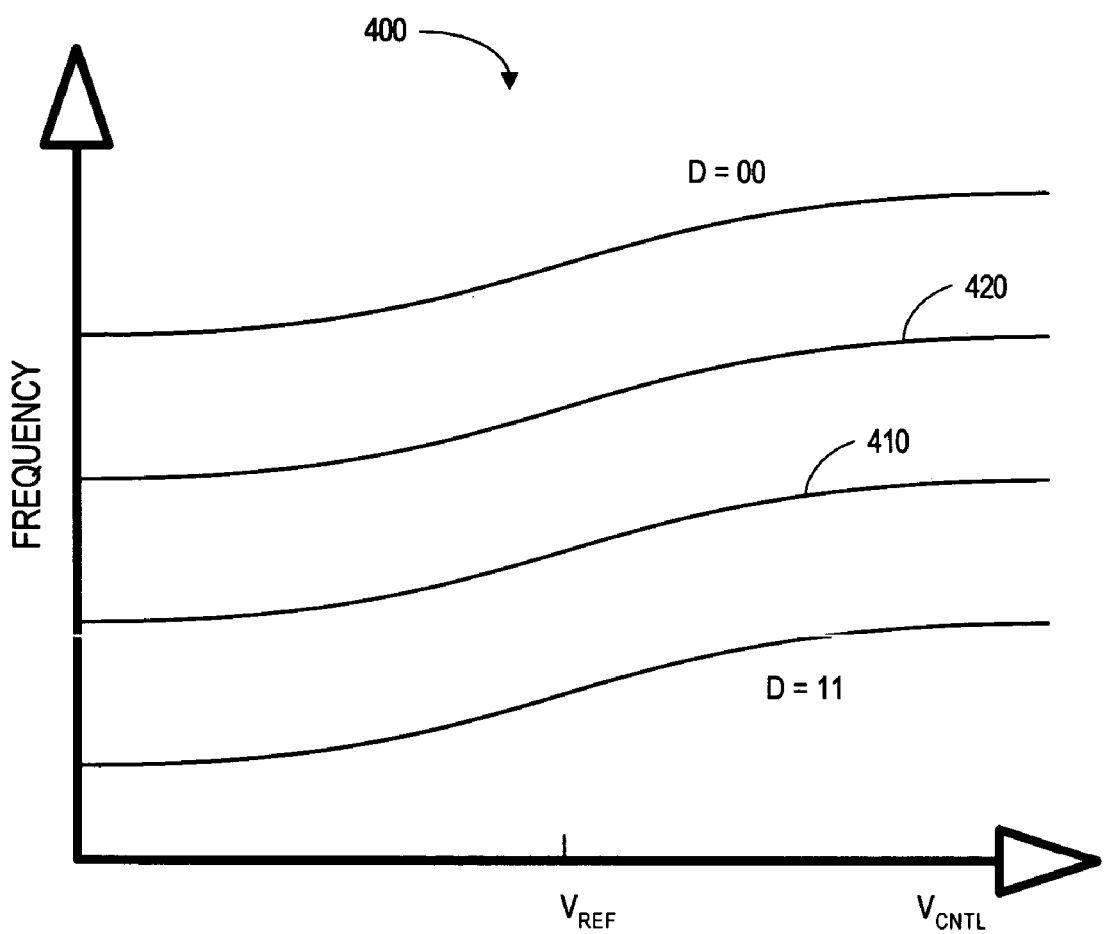
FIG. 4 illustrates a frequency tuning curve for a quadrature VCO according to some embodiments.

Consider, for example, one of the curves illustrated in FIG. 4. As Vcnt1 is increased, the frequency at which the quadrature VCO 300 operates will also increase.

In general, the range over which the quadrature VCO 300 can be tuned may be determined by the sharpness of the loop gain Alternating Current (AC) response of the underlying core VCOs, which in turn may be limited by the quality factor of the LC tanks (e.g., the sharpness of the loop gain response may increase with the quality factor of the LC tanks). Thus, to provide a sufficiently large tuning range (e.g., to support clock generation for various types of communication devices), a quadrature VCO might have inductors with a low quality factor and/or a large coupling current. Either measure, however, could introduce an undesirable amount of jitter in the clock signals.

Reduced supply voltages in Complementary Metal Oxide Semiconductor (CMOS) processes (e.g., 90 nm and 65 nm processes) may introduce other VCO design problems. For example, with a reduced power supply the VCO gain may need to be substantially larger in order to accommodate the same frequency tuning range. This can cause the VCO to be more sensitive to external noise (e.g., reference spurs and substrate coupling). By way of example, in a 10 GHz optical application the required frequency tuning range for a VCO might be over 2 GHz in order to cover different data rates that exist in optical networks (e.g., 9.95 Gbps to 12.5 Gbps). With a 1.2 volt power supply, the VCO gain could be more than 4.0 GHz/V.

Other factors can impact the size of the frequency tuning range. In a varactor-type LC-VCO, for example, a large frequency tuning range might need a varactor with a large capacitance ratio. At 10 GHz frequency, the quality factor of a varactor may become dominant in the LC tank and degrade the phase noise performance of a VCO over a large frequency range. As another example, the frequency tuning range of a current-coupled quadrature LC-VCO might conflict with power consumption and phase noise performance.

Referring again to FIG. 3, a digitally controlled capacitor array 320 may be coupled in parallel with the first and second LC tanks according to some embodiments. For example, the capacitor array 320 may be connected to the four outputs of the quadrature VCO (P0, P90, P180, and P270) and control signal $D_0$ through $D_{k-1}$ may determine the amount of capacitance associated with the array 320.

For example, assume that the capacitor array 320 receives a control signal ($D_0$ and $D_1$). In this case, a control signal of "00," "01," "10," and "11" would each introduce a different amount of capacitance to the circuit (e.g., by switching on various capacitance cells). As a result, four different frequency tuning curves may be used (each with a different center frequency). According to some embodiments, the 0th cell in the capacitor array is used as a base cell, and the kth cell is constructed with $2^k$ units of the base cell. Note that the control signals might be binary coded or in other weights and/or coding formats.

FIG. 4 illustrates four frequency tuning curves 400 for a quadrature VCO according to some embodiments. That is, the circuit of FIG. 3 might exhibit one frequency tuning curve 410 when one set of control bits are provided to the capacitor array 320 and another frequency tuning curve 420 when another set of control bits are provided. A particular frequency on the selected tuning curve may then be controlled via Vcnt1. Depending on the design of the circuit, the highest frequency of one curve might overlap or otherwise be associated with the lowest frequency of a neighboring curve (e.g., to provide a large overall frequency range and/or to cover four different frequency ranges of interest). Although a two-bit control signal is illustrated in FIG. 4, note that any number of bits may be provided (e.g., a four-bit control signal might be used to select one of sixteen frequency curves).

By using the digitally switched capacitor array 320, the range of each frequency tuning curve may be relatively small (e.g., only one frequency band may need to be covered by one curve over process, temperature and supply voltage variations), but the quadrature VCO 300 may still have an acceptable overall tuning range because of the coarse tuning provided by the capacitor array. Moreover, the reduced tuning range of each curve may make it possible to achieve sufficient jitter performance with moderate power consumption. As a result, the approach may be suitable for a lower-power high transistor density communication system (e.g., associated with an optical or wireless communication device).

According to some embodiments, on-chip registers are used to configure the control signal ($D_0$ through $D_{k-1}$) to setup a capacitor array such that the center frequency of one of the frequency curves (e.g., at $V_{REF}$) substantially meets a targeted operating frequency. Note that when frequency curves overlap, more than one curve might be useable to generate a particular frequency. Moreover, one of the useable curves might be more appropriate as compared to the others (e.g., one curve might provide better dynamic performance when the VCO is used in a phase-locked loop). A designer could manually setup the control registers through trial and error to obtain a satisfactory centered tuning curve. Such an approach, however, might be time consuming or otherwise impractical.

According to some embodiments, selection logic (not illustrated in FIG. 3) generates the control signal that is provided to the capacitor array 320. For example, the selection logic might determine a frequency associated with the quadrature VCO 300 (e.g., by determining a frequency at which the quadrature VCO 300 should operate). The center frequency of the quadrature VCO 300 may then be adjusted as appropriate via the digitally controlled capacitor array 320 (e.g., by setting the control signal to select the appropriate tuning curve). That is, the digitally controlled capacitor array 320 may provide an automatically determined course frequency adjustment while Vcnt1 provides a fine frequency adjustment for the quadrature VCO 300.

Figure 5:
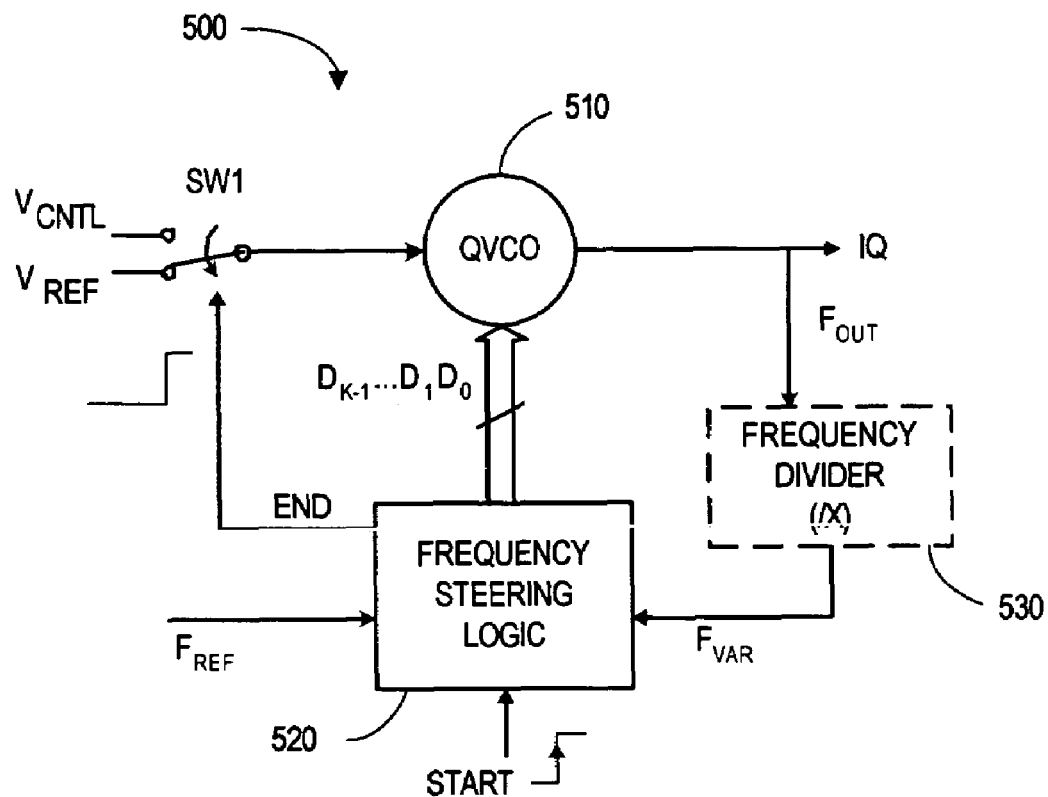
FIG. 5 is a block diagram of an apparatus having frequency steering logic according to some embodiments.

FIG. 5 is a block diagram of an apparatus 500 according to some embodiments. The apparatus 500 includes a quadrature VCO 510 that receives a signal through a switch SW1 and generates signal IQ with a frequency $F_{OUT}$ (and $F_{OUT}$ is adjustable via control bits $D_0$ through $D_{k-1}$). The control bits are set by frequency steering logic 520 which receives an indication associated with the signal having frequency $F_{OUT}$ from a frequency divider 530. In particular, the frequency divider 530 receives $F_{OUT}$ and generates the indication having a frequency equal to $F_{OUT}/X$ (referred to as $F_{VAR}$ in FIG. 5). The frequency steering logic 520 may, for example, compare a reference signal having a frequency $F_{REF}$ with the signal having frequency $F_{VAR}$ and adjust the control bits $D_0$ through $D_{k-1}$ such that the quadrature VCO 510 output frequency is near $F_{REF}*X$.

In normal operation, the quadrature VCO 510 receives an input control voltage Vcnt1 from the switch to provide for fine frequency tuning. The rising edge of a "start" signal might be used, for example, by the frequency steering logic 520 to initiate an automatic frequency centering process. During this process, switch SW1 can be switched to a reference voltage Vref associated with a targeted quadrature VCO 510 center frequency, $F_{OUT}=F_{REF}*X$. When the automated centering process is complete, SW1 may be switched back to Vcnt1 using an "end" signal.

Figure 6:
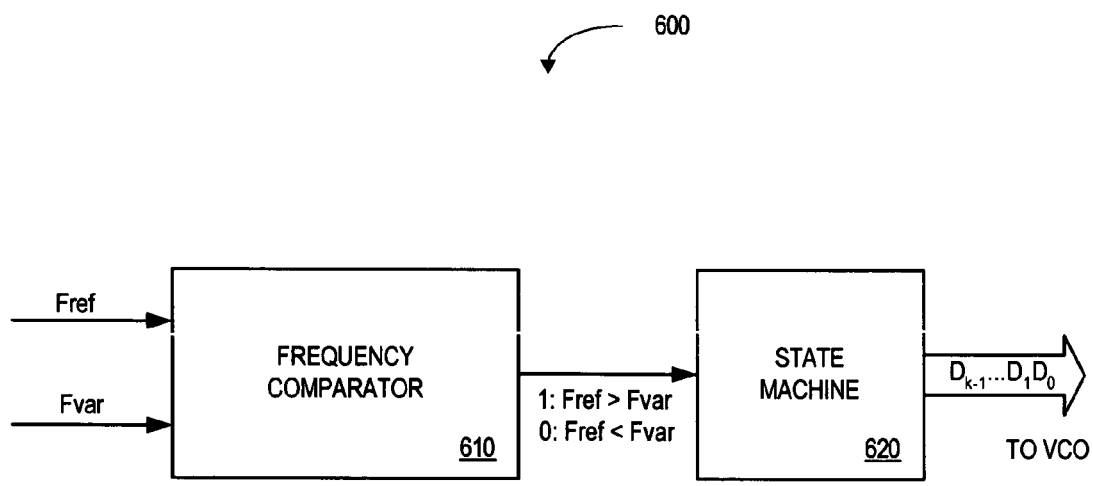
FIG. 6 is a block diagram of frequency steering logic according to some embodiments.

FIG. 6 is a block diagram of frequency steering logic 600 according to some embodiments. The logic 600 includes a frequency comparator 610 to compare an indication of an oscillator's frequency ($F_{VAR}$) with a frequency of a reference signal ($F_{REF}$) and a state machine 620 to adjust a digital control signal ($D_0$ through $D_{k-1}$) based on the comparison. In particular, the frequency comparator may generate a "1" when $F_{REF}$ is greater than $F_{VAR}$ and a "0" when $F_{REF}$ is less than $F_{VAR}$. The state machine 620 may then set the control signal as appropriate (e.g., to increase or decrease the frequency of a quadrature VCO).

Figure 7:
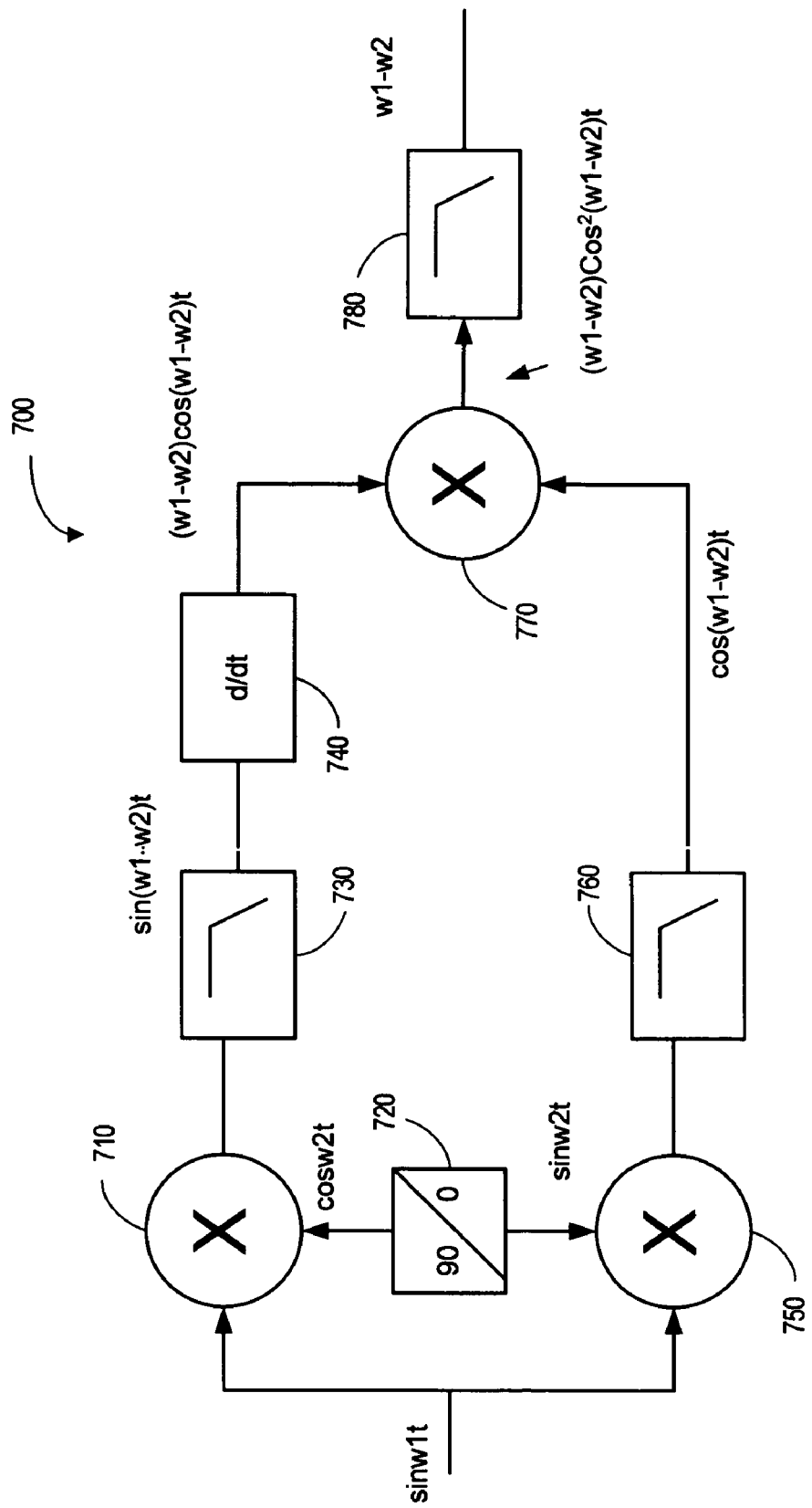
FIG. 7 is a block diagram of a frequency comparator according to one embodiment.

The frequency comparator 610 might be implemented in any number of ways. By way of example, frequency mixing and filtering might be used to determine the difference in frequency between $F_{REF}$ and $F_{VAR}$. FIG. 7 is a block diagram of a frequency comparator 700 that could be used with such an approach. In this case, a first mixer 710 combines $\sin(\omega_1 t)$ and $\cos(\omega_2 t)$ from a quadrature generator 720 and provides the result to a low pass filter 730. The output of the low pass filter 730 travels through a differentiator 740 and the result represents $(\omega_1-\omega_2)\cos(\omega_1-\omega_2)t$.

A second mixer 750 combines sin w1t and sin w2t from the quadrature generator 720 and provides the result to a low pass filter 760. The output of that low pass filter 760 represents $\cos(\omega_1-\omega_2)t$. A third mixer 770 combines these two signals and the result is passed through another low pass filter 780 to generate $\omega_1-\omega_2$ (e.g., which could represent the frequency difference between $F_{REF}$ and $F_{VAR}$).

Figure 8:
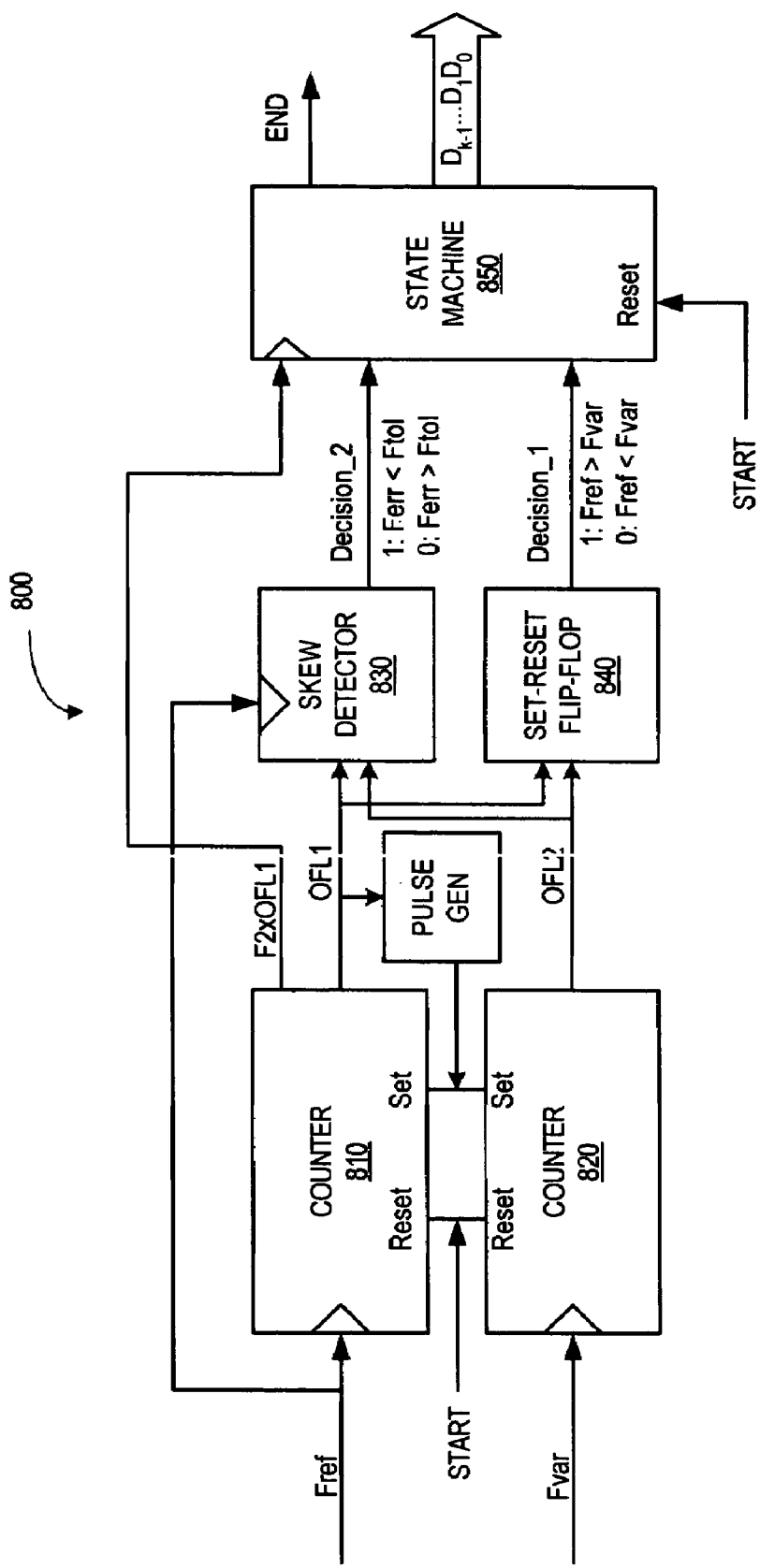
FIG. 8 is a block diagram of digital frequency steering logic according to another embodiment.

FIG. 8 is a block diagram of digital frequency steering logic 800 according to another embodiment. The logic 800 may, for example, use an external "start" signal as a trigger (otherwise, the logic 800 may be self-timed). When activated, a first counter 810 will count pulses in the reference signal having frequency $F_{REF}$ and generate a first overflow signal OFL1 after a first pre-determined number of pulses have been counted. A second counter 820 counts pulses in the signal having frequency $F_{VAR}$ and generates a second overflow OFL2 signal when a second pre-determined number of pulses have been counted.

A skew detector 830 may receive OFL1 and OFL2 and determine, based on these signals, whether or not the magnitude of the difference between $F_{REF}$ and $F_{VAR}$ (labeled $F_{ERR}$ in FIG. 8) is greater than a threshold amount (labeled $F_{TOL}$ in FIG. 8). Note that the time lapse between the occurrence of the two overflow signals may reflect the magnitude of the difference between $F_{REF}$ and $F_{VAR}$. The result of this determination (labeled "Decision_2" in FIG. 8) may then be provided to a state machine 840.

A set-reset flip-flop 840 may act as a "direction" detector. That is, the flip-flop 840 may determine, based on the overflow signals, whether $F_{REF}$ is greater than $F_{VAR}$ (e.g., because OFL1 occurred before OFL2, in which case the frequency of a quadrature VCO should be increased) or less than $F_{VAR}$ (e.g., because OFL2 occurred before OFL1, in which case the frequency of the quadrature VCO should be decreased). The result of this decision (labeled "Decision_1" in FIG. 8) may also be provided to the state machine 850.

Figure 9:
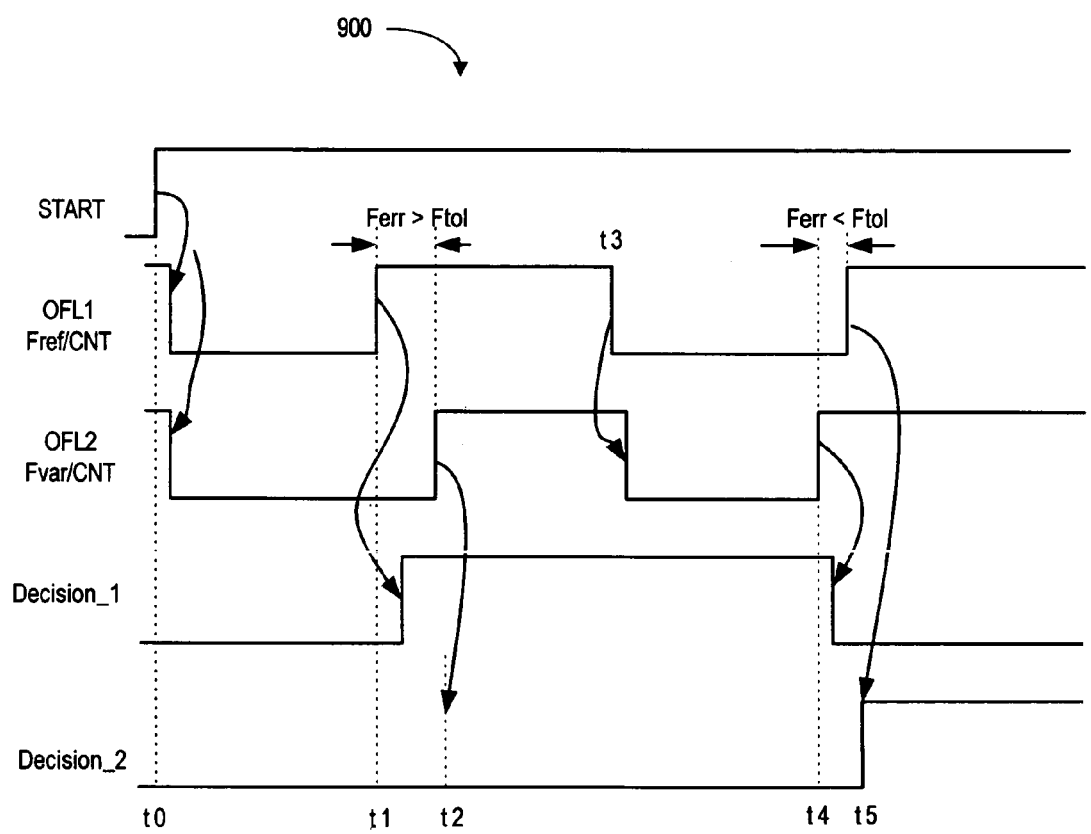
FIG. 9 illustrates signals associated with a frequency comparator according to some embodiments.

The state machine 850 may then adjust the bits of a control signal as appropriate (e.g., to increase or decrease the frequency of the quadrature VCO by changing an amount of capacitance). For example, FIG. 9 illustrates signals that may be associated with a frequency comparator according to some embodiments.

At time t0, the rising edge of the start signal causes the two counters 810, 820 to be reset (and both OFL1 and OFL2 are "low"). The two counters 810, 820 will then start to count pulses at different speeds according to the input frequency of $F_{REF}$ and $F_{VAR}$. At time t1, OFL1 overflows indicating that $F_{REF}$ has a higher frequency than $F_{VAR}$. As a result, the signal Decision_1 is set to "high."

Moreover, the skew detector 830 detects that $F_{ERR}$ (i.e., $|F_{REF}-F_{VAR}|$) is larger than $F_{TOL}$, and therefore signal Decision_2 is set "low" at time t2. Note that $F_{TOL}$ might be a pre-determined design variable representing a maximal tolerable frequency error between $F_{REF}$ and $F_{VAR}$. Moreover, the frequency tolerance at the VCO output might be associated with $F_{TOL}*X$ (where X is the ratio of a frequency divider 530).

The values of Decision_1 and Decision_2 are used by the state machine 840 to adjust control bits $D_0$ through $D_{k-1}$ after time t2 such that the VCO frequency is increased (because the existing error in frequency is unacceptably large). One method of adjusting the control bits is described with respect to FIG. 10.

After the VCO frequency is adjusted and settled, the two input counters 810, 820 are reset by the falling edge of OFL1 at time t3, and a new cycle of frequency comparison begins. At time t4, OFL2 generates an overflow signal before OFL1. As a result, Decision_1 becomes "low" to indicate $F_{REF}$ has a lower frequency than $F_{VAR}$.

In this case, however, the skew detector 830 detects that $F_{ERR}$ (i.e., $|F_{REF}-F_{VAR}|$) is not larger than $F_{TOL}$, and therefore signal Decision_2 is set to "high" at time t5. That is, the difference or error in the frequency of the quadrature VCO output is acceptable. This may then cause the state machine 840 to generate an "end" signal to stop the automatic adjustment of the capacitor array (e.g., because an appropriate amount of capacitance has been found). According to some embodiments, some or all of these timing sequences are self-timed through the outputs OFL1 and F2xOFL1 of the first counter 840.

The state machine 840 might decide how to adjust the control bits $D_0$ through $D_{k-1}$ in a number of ways. For example, an initial value of "000" could be used and incremented by one (to "001," "010," "011,"etc.) until an acceptable output frequency is obtained. Instead of sweeping through all possible values, a faster binary search algorithm (e.g., successive-approximation) might be used.

Figure 10:
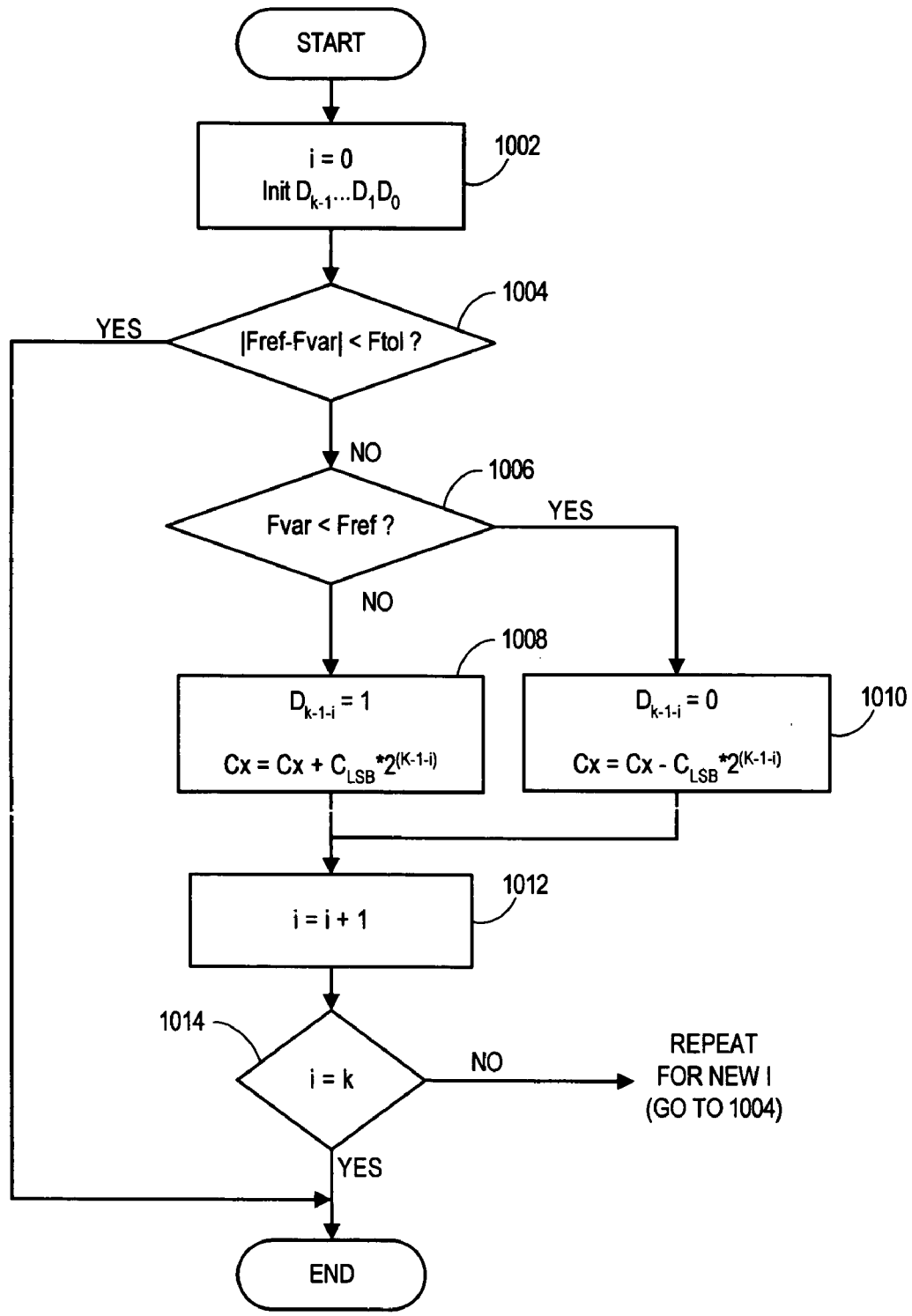
FIG. 10 is a flow chart of a successive approximation method according to some embodiments.

For example, assume that a quadrature VCO uses a binary-weighted capacitor array to tune the frequency, and that setting $D_{k-1}$ to "1" will switch in the kth-bit capacitor having a capacitance of $2^k*C_{LSB}$. In this case, FIG. 10 is a flow chart of a successive approximation method that might be used in connection with the digital frequency steering logic 800.

At 1002, i is initialized to "0" along with $D_0$ through $D_{k-1}$. If the magnitude of $|F_{REF}-F_{VAR}|$ ($F_{ERR}$) is less than $F_{TOL}$ at 1004, the amount of frequency error is acceptable and the process ends. Note that fine tuning of the frequency (e.g., via Icoup) may still be performed.

If the magnitude of $|F_{REF}-F_{VAR}|$ ($F_{ERR}$) is not less than $F_{TOL}$ at 1004, the frequency error is not acceptable, and it is determined at 1006 whether $F_{VAR}$ is less than $F_{REF}$. If it is not less, control bit $D_{k-1-i}$ (which is the Most Significant Bit (MSB) or $D_{k-1}$ because i equals "0") is set to "1" at 1008, causing capacitor $C_{k-1-i}$ ($C_{k-1}$) to be switched into the quadrature VCO. The addition of $2^{k-1}*C_{LSB}$ capacitance to the system will cause the frequency of the output signal to be reduced (e.g., a lower frequency curve has been selected). If $F_{VAR}$ is less than $F_{REF}$ at 1006, control bit $D_{k-1-i}$ is set to "0" at 1010, and the amount of capacitance associated with $C_{k-1-i}$ is not added to the system.

In either case, the next bit in the control signal is selected at 1012 (by incrementing i). If there are no more bits remaining at 1014 (i=k and therefore all bits have been set), the process ends. Otherwise, the process is repeated for the new bit.

Figure 11:
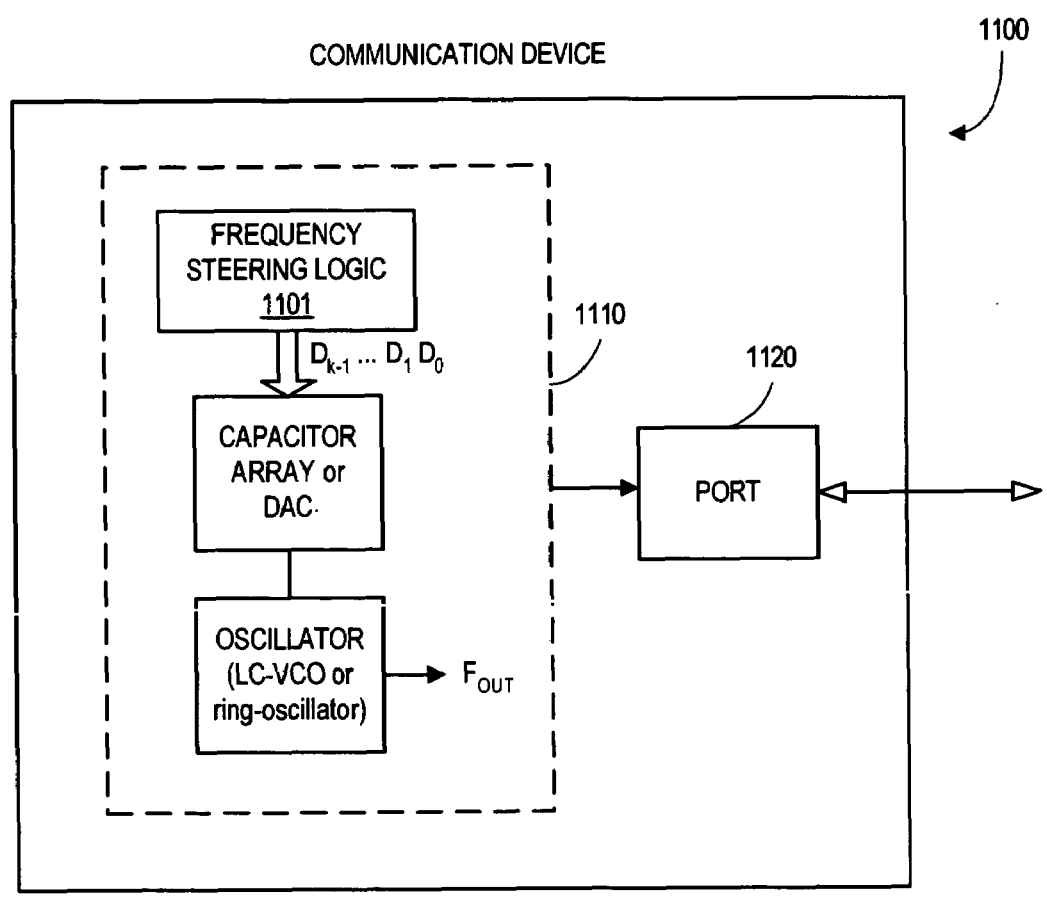
FIG. 11 is a block diagram of a system according to some embodiments.

FIG. 11 is a block diagram of a system 1100 according to some embodiments. In particular, the system 1100 includes a device 1110 that generates clock signals with any type of oscillator (e.g., a quadrature VCO as described previously, a conventional LC-VCO, or ring-oscillator) in accordance with any of the embodiments disclosed herein. The frequency of the oscillator may be tuned by the frequency steering logic 1101 in accordance with any of the embodiments disclosed herein through a capacitor array, or by way of controlling the current or voltage of the oscillator through a Digital-to-Analog Converter (DAC). The device 1110 may be associated with, for example, a receiver, a transmitter, an optical communication device (e.g., a 10 GHz SONET receiver), and/or a wireless communication device. The system 1100 may further include a communication port 1120 adapted to exchange information via a network. For example, the system 1100 may comprise a wireless communication device (e.g., associated with a direct down-conversion wireless transceivers or a cellular system), in which case the communication port 1120 might be associated with an antenna.

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although particular designs for a frequency comparators have been described herein, other designs may be used according to other embodiments. Similarly, a digitally switched capacitor array having any number of cells (including a single cell) may be used in accordance with the embodiments described herein. As another example, other techniques might be used to select an appropriate tuning curve. For example, the control bits might be initialized to select a middle curve of a set of possible curves. Based on a first timing result, selection logic might next choose a curve halfway between the middle curve and the highest or lowest curve (depending on whether the frequency needs to be increased or decreased). This process may then be repeated until an acceptable curve is selected.

The several embodiments described herein are solely for the purpose of illustration. Persons skilled in the art will recognize from this description other embodiments may be practiced with modifications and alterations limited only by the claims.

What is claimed is:

1. An apparatus, comprising:
a frequency adjustor to adjust a frequency of a quadrature voltage controlled oscillator, wherein the frequency adjustor comprises (i) at least one variable bias current source to provide a fine frequency adjustment and (ii) a plurality of capacitors, selectable based on a multi-bit digital control signal, to provide a course frequency adjustment; and
selection logic to adjust the multi-bit digital control signal based on a received indication of the oscillator's frequency, wherein the selection logic comprises:
a first counter to count pulses in a reference signal and to generate a first overflow signal when a first pre-determined number of pulses are counted,
a second counter to count pulses in the received indication of the oscillator's frequency and to generate a second overflow signal when a second pre-determined number of pulses are counted,
a skew detector coupled to the first and second counters to determine, based on the first and second overflow signals, if the frequency of the received indication differs from the frequency of the reference signal by more than a threshold amount,
a direction detector coupled to the first and second counters to determine, based on the overflow signals, if the frequency of the received indication is greater than or less than the frequency of the reference signal, and
a state machine to receive a skew bit from the skew detector and a direction bit from the direction detector and to adjust the digital control signal based on the two received bits.

2. The apparatus of claim 1, further comprising:
a frequency divider to generate the indication of the quadrature voltage controlled oscillator's frequency based on a signal received from the quadrature voltage controlled oscillator.

3. The apparatus of claim 1, wherein the quadrature voltage controlled oscillator comprises:
a first voltage controlled oscillator having a 0 degree phase node and a 180 degree phase node; and
a second voltage controlled oscillator having a 90 degree phase node and a 270 degree phase node, wherein the first and second voltage controlled oscillators are mutually coupled to create the quadrature voltage controlled oscillator.

4. The apparatus of claim 3 wherein the quadrature voltage controlled oscillator further comprises:
a first inductor-capacitor tank coupled to the first voltage controlled oscillator; and
a second inductor-capacitor tank coupled to the second voltage controlled oscillator.

5. The apparatus of claim 4, wherein the capacitor array is coupled in parallel with the first and second inductor-capacitor tanks.

6. The apparatus of claim 1, wherein the quadrature voltage controlled oscillator is associated with at least one of: (i) clock generation, (ii) clock recovery, (iii) a receiver, (iv) a transmitter, (v) an optical communication device, or (vi) a wireless communication device.

* * * * *